(12) United States Patent
Tomohiro et al.

(10) Patent No.: US 9,263,249 B2
(45) Date of Patent: Feb. 16, 2016

(54) METHOD AND APPARATUS FOR MANUFACTURING SEMICONDUCTOR DEVICE

(75) Inventors: Watanabe Tomohiro, Aizuwakamatsu (JP); Fumihiko Inoue, Aizuwakamatsu (JP)

(73) Assignee: Cypress Semiconductor Corporation, San Jose, CA (US)

( * ) Notice: Subject to any disclaimer, the term of this patent is extended or adjusted under 35 U.S.C. 154(b) by 1110 days.

(21) Appl. No.: 12/166,290

(22) Filed: Jul. 1, 2008

(65) Prior Publication Data

US 2009/0011600 A1 Jan. 8, 2009

(30) Foreign Application Priority Data

Jul. 4, 2007 (JP) .................................. 2007-175888

(51) Int. Cl.

| | |
|---|---|
| *H01L 21/31* | (2006.01) |
| *H01L 21/469* | (2006.01) |
| *H01L 21/28* | (2006.01) |
| *H01L 21/67* | (2006.01) |
| *H01L 21/02* | (2006.01) |
| *H01L 29/792* | (2006.01) |

(52) U.S. Cl.
CPC .... *H01L 21/02057* (2013.01); *H01L 21/28282* (2013.01); *H01L 21/67028* (2013.01); *H01L 29/7923* (2013.01)

(58) Field of Classification Search
CPC .................. H01L 21/31111; H01L 21/02052; H01L 21/02057
USPC ............... 134/1.3, 2, 3, 26, 28, 34, 4; 216/83; 438/694, 745

See application file for complete search history.

(56) References Cited

U.S. PATENT DOCUMENTS

| | | | | |
|---|---|---|---|---|
| 5,296,385 | A * | 3/1994 | Moslehi et al. ................ | 438/514 |
| 5,489,557 | A * | 2/1996 | Jolley ............................. | 438/476 |
| 5,879,576 | A * | 3/1999 | Wada et al. ..................... | 216/91 |
| 6,002,202 | A * | 12/1999 | Meyer et al. ................... | 313/420 |
| 6,875,284 | B2 * | 4/2005 | Scranton .......................... | 134/1 |
| 2001/0045224 | A1 * | 11/2001 | Kamikawa et al. ............. | 134/61 |
| 2005/0245082 | A1 * | 11/2005 | Perng et al. .................... | 438/687 |
| 2006/0003101 | A1 * | 1/2006 | Yim et al. ................... | 427/248.1 |
| 2006/0014393 | A1 * | 1/2006 | Lu et al. ......................... | 438/704 |
| 2006/0286783 | A1 * | 12/2006 | Papanu et al. ................. | 438/510 |

* cited by examiner

*Primary Examiner* — Allan Olsen
*Assistant Examiner* — Margaret D Klunk

(57) ABSTRACT

The present invention is directed to a method and an apparatus for manufacturing a semiconductor device including step S22 to form an insulating film on a front surface of a semiconductor wafer that is a surface on which a semiconductor element is to be formed and on a back surface that is a surface opposing the front surface, step S26 to remove the insulating film formed on the back surface by selectively providing a first chemical on the back surface of the semiconductor wafer, and step S30 to remove the insulating film formed on the front surface by simultaneously immersing the plurality of semiconductor wafers in a second chemical.

16 Claims, 13 Drawing Sheets

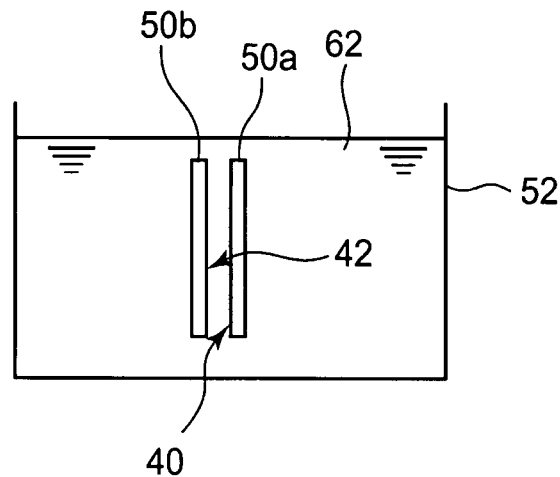
FIG.2A 1ST PROCESS
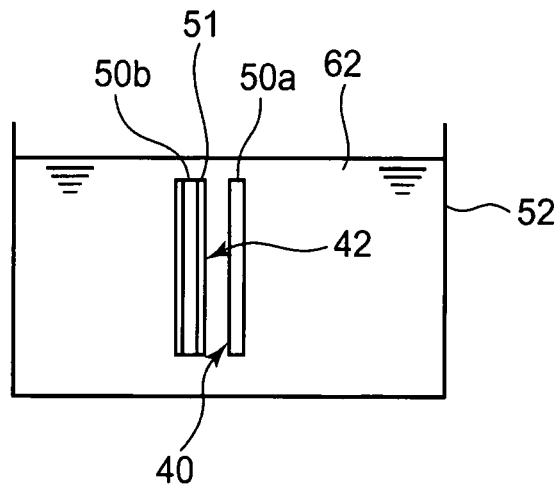
FIG.2B 2ND PROCESS

FIG.3A  BEFORE CHEMICAL TREATMENT IN
1ST PROCESS: 142 PCS.
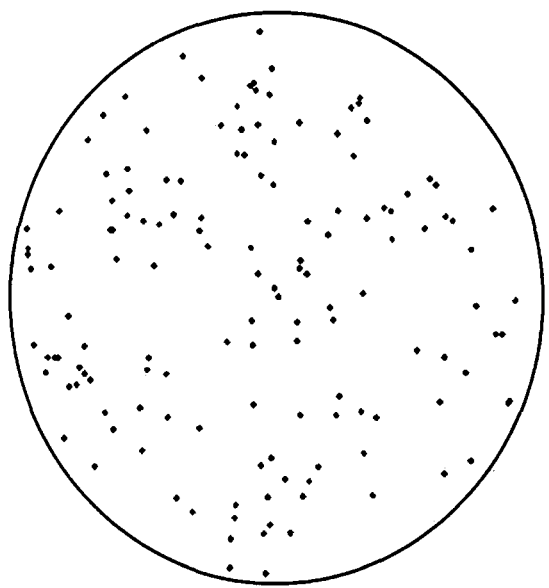
FIG.3B  AFTER CHEMICAL TREATMENT IN
1ST PROCESS: 251 PCS.
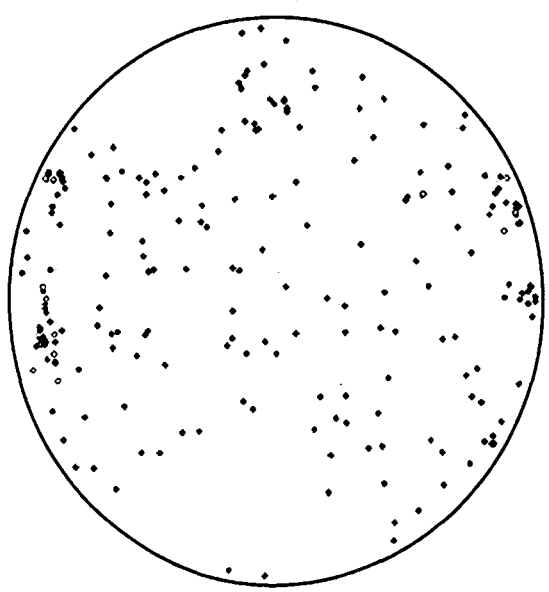

BEFORE CHEMICAL TREATMENT IN
2ND PROCESS: 48 PCS.

AFTER CHEMICAL TREATMENT IN
2ND PROCESS: 34,882 PCS.

INSPECTION: 10,986 PCS.

INSPECTION: 7,206 PCS.

1ST INSPECTION: 12,228 PCS.

2ND INSPECTION: 3,176 PCS.

3RD INSPECTION: 3,642 PCS.

US 9,263,249 B2

METHOD AND APPARATUS FOR MANUFACTURING SEMICONDUCTOR DEVICE

CROSS-REFERENCE TO RELATED APPLICATIONS

The present invention is based on Japanese Patent Application No. 2007-175888 filed on Jul. 4, 2007, the disclosure of which is hereby incorporated by reference.

TECHNICAL FIELD

The present invention relates to a method and an apparatus for manufacturing a semiconductor device and, more particularly, to a method for manufacturing a semiconductor device which includes a process to remove insulating films formed on front and back surfaces of a semiconductor wafer and an apparatus for manufacturing the same.

BACKGROUND OF THE INVENTION

In a method for manufacturing a semiconductor device, an insulating film is formed on a front surface (the surface on which a semiconductor element to be formed) of a semiconductor wafer. However, when the insulating film is formed on the semiconductor wafer using, for example, a chemical vapor deposition (CVD) method and a thermal oxidation method, the insulating film is formed on both surfaces of the front and back (an opposite side to the front surface) of the semiconductor wafer. When removing the insulating films formed on the surfaces of the semiconductor wafer as described above, the insulating films formed on the front and back surfaces of the semiconductor wafer are simultaneously removed by wet etching in batch processing.

In Japanese Patent Application Publication No. JP-A-2003-59931, in order to remove dust and foreign objects adhered on a back surface of a semiconductor wafer, a technique to selectively spray purified water onto the back surface of the semiconductor wafer and then to chemically treat the semiconductor wafer in batch processing has been disclosed. In Japanese Patent Application Publication No. JP-A-2004-356593, in order to remove particles adhered on a thin film which is formed on a back surface of a semiconductor wafer, a technique to partially etch the thin film on the back surface has been disclosed.

SUMMARY OF THE INVENTION

An object of the present invention is, when removing insulating films formed on both surfaces of a semiconductor wafer by wet etching in batch processing, to prevent particles from adhering onto the front surface of the semiconductor wafer.

According to an aspect of the present invention, there is provided a method for manufacturing a semiconductor device including: forming an insulating film on a front surface of a semiconductor wafer that is a surface on which a semiconductor element is to be formed and on a back surface that is a surface opposing the front surface; removing the insulating film formed on the back surface by selectively providing a first chemical on the back surface of the semiconductor wafer; and removing the insulating film formed on the front surface by simultaneously immersing more than one such semiconductor wafer in a second chemical. When removing the insulating film formed on both the front and back surfaces of the semiconductor wafer, the adhesion of particles onto the front surface of the semiconductor wafer can be prevented.

According to another aspect of the present invention, there is provided an apparatus for manufacturing a semiconductor device including: a first processor that removes, by selectively providing a first chemical on a back surface of a semiconductor wafer that is a surface opposing a front surface of the semiconductor wafer that is a surface on which a semiconductor element is to be formed, a first insulating film formed on the back surface; a second processor that removes, by immersing more than one such semiconductor wafer in a second chemical, a second insulating film formed on the front surface; and a controller that processes the plurality of semiconductor wafers one at a time with the first processor and then processes the semiconductor wafers simultaneously with the second processor. It is thus possible to provide the apparatus for manufacturing a semiconductor device that prevents the adhesion of particles to the front surface of the semiconductor wafer.

BRIEF DESCRIPTION OF THE DRAWINGS

FIGS. 2A and 2B are illustrations respectively showing a first process and a second process;

FIGS. 3A and 3B are respective distribution maps of particles on a front surface 40 of a semiconductor wafer 50a before and after a chemical treatment of the first process;

DETAILED DESCRIPTION

Figure 1A:
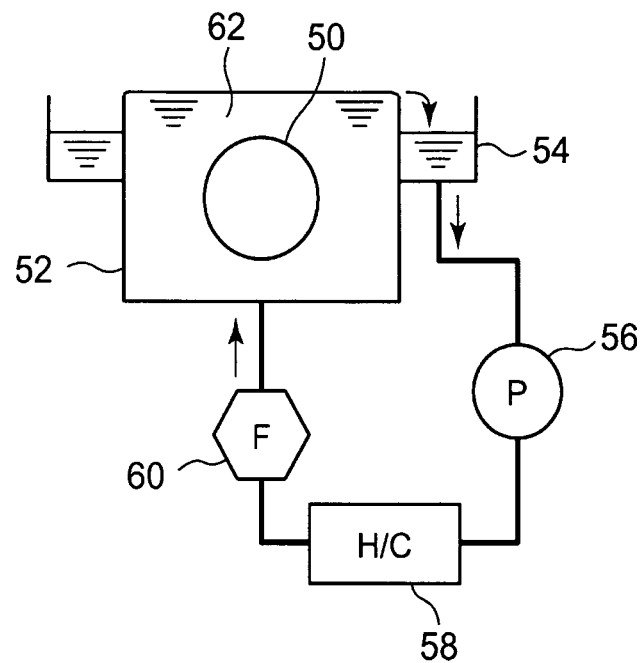
FIG. 1A is a schematic view of a chemical treatment device of a batch processing type and FIG. 1B is a side view of a chemical bath.
Figure 1B:
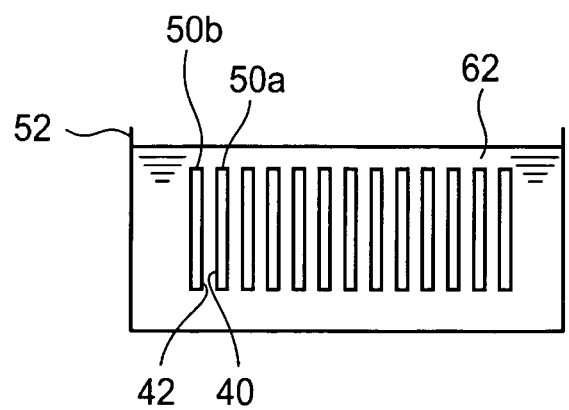

First, a chemical treatment device of a batch processing type will be described. FIGS. 1A and 1B are schematic views of the chemical treatment device of the batch processing type. A chemical bath 52 is filled with a chemical 62, and a semiconductor wafer 50 is immersed in the chemical 62. FIG. 1B is a side view of the chemical bath 52. In the chemical bath 52, the plurality of semiconductor wafers 50 are immersed. A back surface 42 of a preceding semiconductor wafer 50b is facing to a front surface 40 of a subsequent semiconductor wafer 50a. In reference to FIG. 1A, the chemical 62 overflowed from the chemical bath 52 is circulated through a collection tank 54, a pump 56, a heating controller 58 and a filter 60. In this circulation, by the filter 60, particles contained in the chemical 62 are removed. The chemical treatment device shown in FIGS. 1A and 1B provides a high throughput and is economically superior as the plurality of semiconductor wafers 50 can be chemically treated in batch.

However, when removing an insulating film formed on the back surface 42 of the semiconductor wafer 50 in batch processing, particles adhere onto the front surface 40 of the subsequent semiconductor wafer 50. Hereafter, an experiment conducted using a silicon oxide film as the insulating film and a hydrofluoric acid solution as the chemical will be described.

In reference to FIG. 2A, as a first process, eight inch silicon semiconductor wafers 50 on which no insulating films and such are formed are immersed in the chemical in the chemical bath 52 for 10 minutes. The chemical 62 is a hydrofluoric acid solution of HF:H2O=1:50. In reference to FIG. 2B, as a second process, using a thermal oxidation method, silicon oxide films 51 with a film thickness of 100 nm are formed on both surfaces of the semiconductor wafer 50b. The back surface 42 of the semiconductor wafer 50b is arranged as to face the front surface 40 of the semiconductor wafer 50a and, as similar to that of the first process, the semiconductor wafers 50 are immersed in the chemical in the chemical bath 52 for 10 minutes.

Figure 4A:
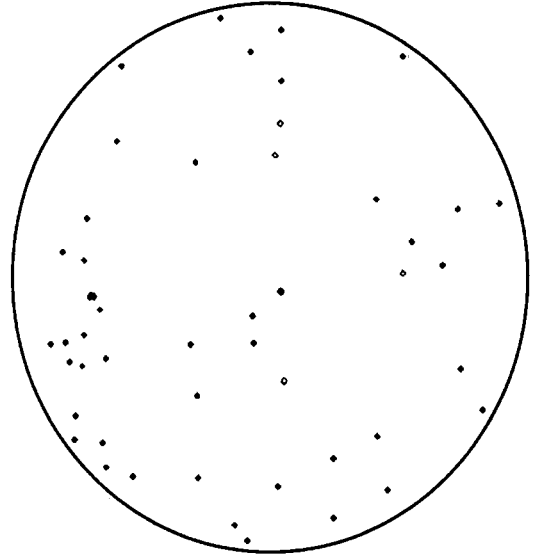
FIGS. 4A and 4B are respective distribution maps of particles on the front surface 40 of the semiconductor wafer 50a before and after a chemical treatment of the second process.
Figure 4B:

FIGS. 3A and 3B are illustrations showing respective inspection results of the front surface 40 of the semiconductor wafer 50a conducted, using a particle inspection device, before and after the first process. FIGS. 4A and 4B are illustrations showing respective inspection results of the front surface 40 of the semiconductor wafer 50a conducted, using the particle inspection device, before and after the second process. FIGS. 3A to 4B indicate the number of particles in a diameter of 0.07 μm or more. In the first process, as the number of particles before the chemical treatment is 142 pieces and that of after the chemical treatment is 251 pieces, the number of particles on the front surface 40 of the semiconductor wafer 50a is hardly increased. Meanwhile, in the second process, as the number of particles before the chemical treatment is 48 pieces and that of after the chemical treatment is 34,882 pieces, the number of particles on the front surface 40 of the semiconductor wafer 50a is sharply increased.

This is because, in the second process, colloidal silica has been formed while etching the silicon oxide film 51 and adhered onto the front surface 40 of the semiconductor wafer 50a. In batch processing, even though the chemical 62 is circulated and particles contained in the chemical 62 are removed as shown in FIG. 1A, as the semiconductor wafers 50 are juxtaposed to each other as shown in FIG. 1B, the particles formed on the back surface 42 of the semiconductor wafer 50b adhere onto the front surface 40 of the semiconductor wafer 50a. Hereafter, embodiments of the present invention, when removing the insulating films formed on both surfaces of the semiconductor wafer, to prevent the particles from adhering onto the front surface of the semiconductor wafer will be described.

First Embodiment

Figure 5:
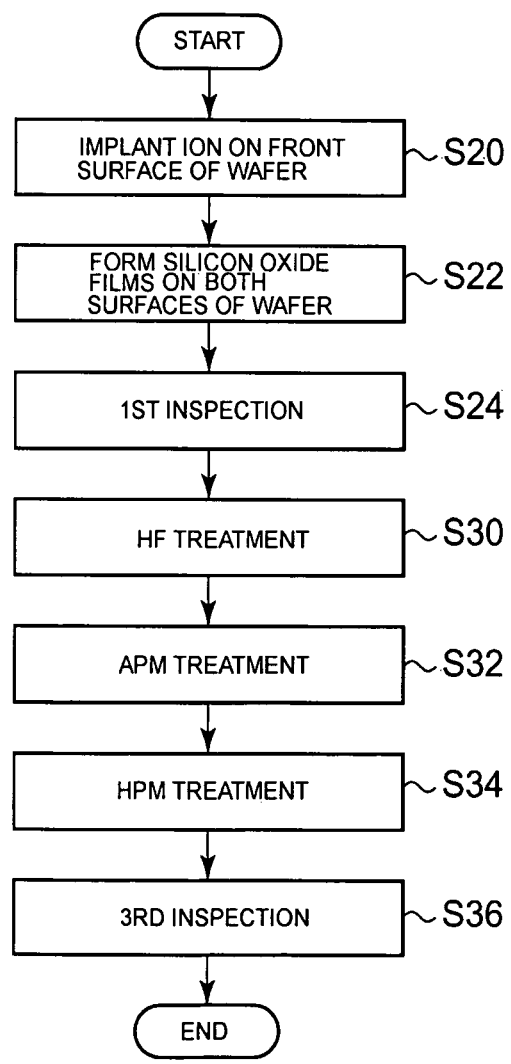
FIG. 5 is a flowchart showing a process of a first comparative example.

FIG. 5 is a flowchart of a method for manufacturing a semiconductor device of a first comparative example. On the surface 40 of the semiconductor wafer 50, an ion implantation is carried out (step S20). On both surfaces of the semiconductor wafer 50, silicon oxide films of an approximate thickness of 17 nm to 18 nm are formed using a thermal oxidation method (step S22). Step S22 is the process carried out to activate the ion implanted dopant by thermal treatment and to clean the ion implanted surface of the semiconductor wafer 50. In batch processing, an HF treatment (a treatment with a mixture solution of HF:H2O mixed at a ratio of 1:50) is carried out (step S30). In batch processing, an APM treatment (a treatment with a mixture solution of NH4OH, H2O2 and H2O) is carried out (step S32). In batch processing, an HPM treatment (a treatment with a mixture solution of HF, H2O2 and H2O) is carried out (step S34). Consequently, the silicon oxide films on the front and back surfaces of the semiconductor wafer 50 are removed.

Figure 6:
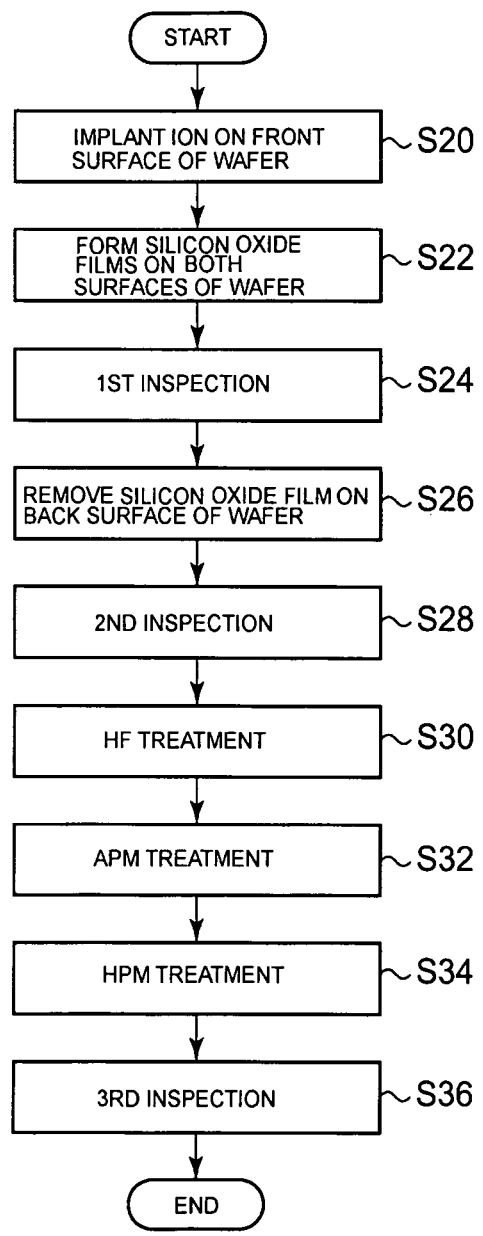
FIG. 6 is a flowchart showing a process of a first embodiment.

FIG. 6 is a flowchart of a method for manufacturing a semiconductor device of a first embodiment. In comparison with the first comparative example, at step S26, a chemical treatment device of a single wafer processing type jet-sprays a hydrofluoric acid solution (a mixture solution of HF:H2O mixed at a ratio of 1:50) onto the back surface 42 of the semiconductor wafer 50 and selectively removes the silicon oxide film. Thereafter, at steps from S30 to S36, the silicon oxide film on the front surface 40 of the semiconductor wafer 50 is removed.

Figure 7:
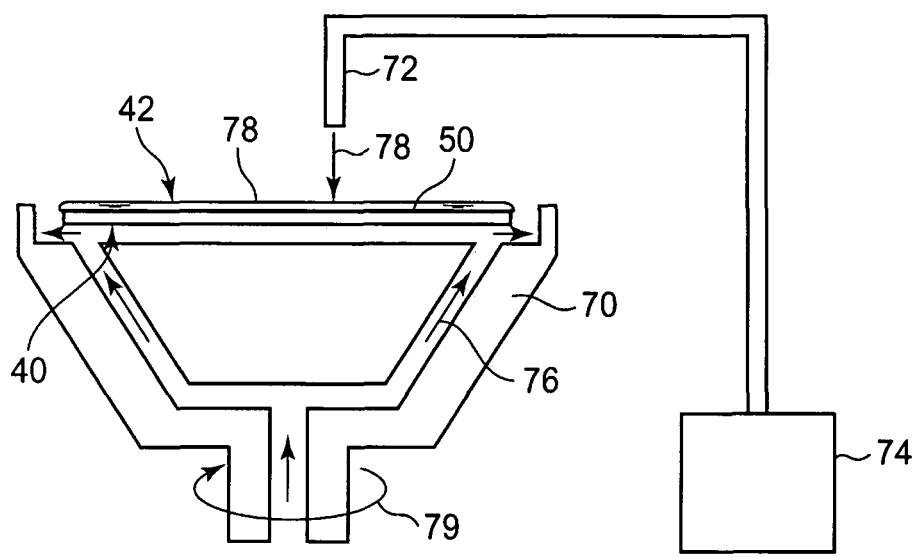
FIG. 7 is a schematic view of a chemical treatment device of a single wafer processing type.

FIG. 7 is a schematic view of the chemical treatment device of the single wafer processing type which selectively carries out the chemical treatment on the back surface 42 of the semiconductor wafer 50. The semiconductor wafer 50 is mounted onto a stage 70 with the front surface 40 facing down. From a circumference of the surface of the stage 70, a nitrogen gas 76 is jetted out to prevent the front surface 40 of the semiconductor wafer 50 from contacting to the stage 70. The stage 70 is rotated in a direction of an arrow 79. A chemical 78 provided from a chemical tank 74 is provided onto the back surface 42 of the semiconductor wafer 50 jet sprayed from a nozzle 72. The chemical 78 on the back surface 42 is spattered, by a centrifugal force, towards a fringe of the semiconductor wafer 50. In this case, the nitrogen gas 76 jetted out from the surface of the stage 70 flows through between the stage 70 and the front surface 40 of the semiconductor wafer 50 towards the fringe. Consequently, spreading the chemical 78 around to the front surface 40 of the semiconductor wafer 50 can be prevented.

In the first comparative example and the first embodiment, a first to third inspections were conducted. The first to third inspections are to count the number of particles of 0.7 μm or more in diameter on the back surface 42 of the semiconductor wafer 50. In reference to FIG. 5, in the first comparative example, the first inspection was conducted between steps S22 and S30 (step S24) and the third inspection was conducted after step S34 (step S36). In reference to FIG. 6, in the first embodiment, the first inspection was conducted between steps S22 and S26 (step S24), the second inspection was conducted between steps S26 and S30 (step S28), and the third inspection was conducted after step S34 (step S36).

Figure 8A:
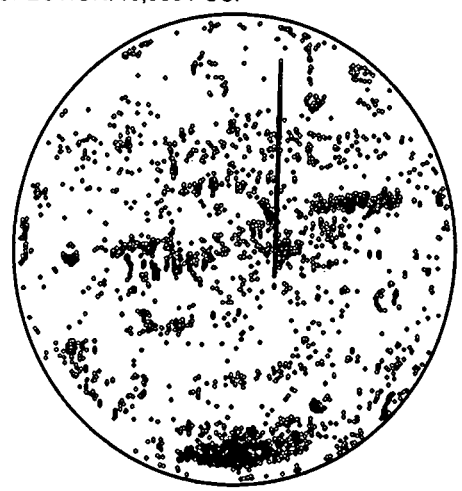
FIGS. 8A and 8B are respective distribution maps of particles on a back surface of the semiconductor wafer in a first inspection and a third inspection of the first comparative example.
Figure 8B:
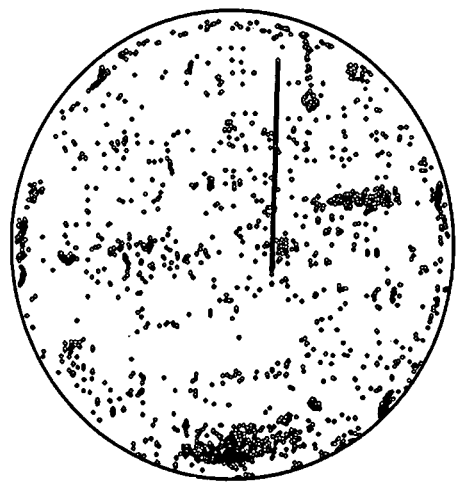
Figure 9A:
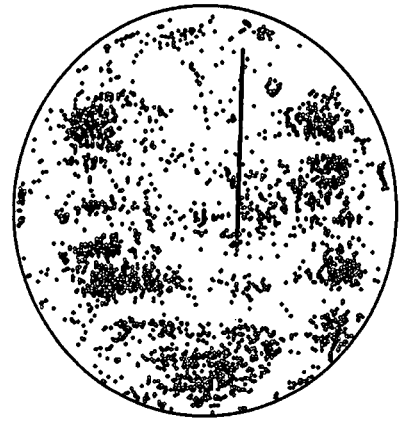
FIGS. 9A to 9C are respective distribution maps of particles on the back surface of the semiconductor wafer in a first inspection to a third inspection of the first embodiment.
Figure 9B:
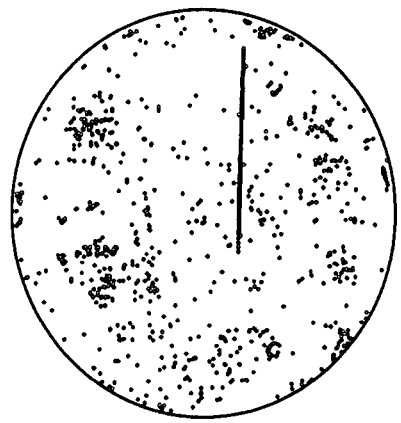
Figure 9C:
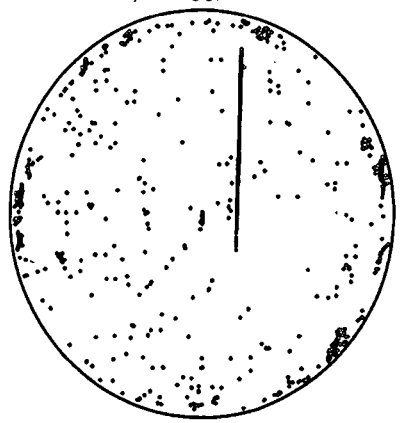

FIGS. 8A and 8B are illustrations showing the respective results of the first inspection and the third inspection conducted in the first comparative example. FIGS. 9A to 9C are illustrations showing the respective results of the first inspection to the third inspection conducted in the first embodiment. In FIGS. 8A to 9C, the respective numbers of particles are indicated. In reference to FIG. 8A, in the first inspection of the first comparative example, measured are 10,986 pieces of particles. This attributes to particles being adhered onto the back surface 42 of the semiconductor wafer 50 when the semiconductor wafer 50 is mounted on the stage of the semiconductor manufacturing apparatus for ion implantation at step S20 and such. In reference to FIG. 8B, in the third inspection of the first comparative example, the number of particles is reduced to 7,206 pieces. The particles reduced between the first and the third inspections are believed to be released in the chemical bath 52 of the chemical treatment device of the batch processing type. Consequently, with reference to FIG. 1B, there is a possibility of the released particles, in the chemical bath 52, to adhere onto the front surface 40 of the opposing semiconductor wafer 50a to the back surface 42 of the semiconductor wafer 50b.

In reference to FIG. 9A, in the first inspection of the first embodiment, measured are 12,228 pieces of particles. In reference to FIG. 9B, in the second inspection of the first embodiment, the number of particles is reduced to 3,176 pieces. This attributes to particles adhered on the back surface 42 of the semiconductor wafer 50 being removed, using the chemical treatment device of the single wafer processing type, by the removal of the silicon oxide film on the back surface 42 of the semiconductor wafer 50 with the hydrofluoric acid solution. In reference to FIG. 9C, in the third inspection of the first embodiment, the number of particles is 3,642 pieces and is hardly changed from the second inspection. Therefore, it is believed that the particles released in the chemical bath 52 of the chemical treatment device of the batch processing type are very few.

According to the first embodiment, as described at step S22 in FIG. 6, the silicon oxide films (insulating films) are formed on the front surface 40 and the back surface 42 of the semiconductor wafer 50. As described at step S26, by selectively providing the hydrofluoric acid solution (a first chemical) onto the back surface 42 of the semiconductor wafer 50, the silicon oxide film formed on the back surface 42 is removed. As described at step S30, by simultaneously immersing the plurality of semiconductor wafers 50 in the hydrofluoric acid solution (a second chemical), the silicon oxide film formed on the front surface 40 is removed.

By the processes described above, first, at step S30 in batch processing, when removing the silicon oxide film from the front surface 40 of the semiconductor wafer 50, the silicon oxide film is not provided on the back surface 42 of the semiconductor wafer 50. Therefore, as described with reference to FIGS. 2A to 4B, the adhesion of particles including colloidal silica on the front surface 40 of the semiconductor wafer 50a can be prevented. As described with reference to FIGS. 6 to 9C, the adhesion of particles being adhered on the back surface 42 of the semiconductor wafer 50b, in batch processing, onto the front surface 40 of the semiconductor wafer 50a can be prevented. Further, with the comparison of FIGS. 8B and 9C, the particles adhering onto the back surface 42 of the semiconductor wafer 50 can be reduced.

Further, as the single wafer processing system is used as described at step S26 when removing the insulating film on the back surface 42 of the semiconductor wafer 50, an increase of particles on the front surface 40 of the semiconductor wafer 50 can be prevented and, as the batch processing system is used as described at step S30 when removing the insulating film on the front surface 40 of the semiconductor wafer 50, the production cost can be reduced.

In the first embodiment, while an example of the thermal oxidation silicon film as the insulating film formed on both surfaces of the semiconductor wafer 50 has been described, a silicon oxidation film formed using, for example, a thermal CVD method may be used. Further, the film may be of other than a silicon oxidation film. When an insulating film contains at least any one of silicon oxide and silicon nitride, colloidal silica is liable to be formed while removing the insulating film. Therefore, in this case, it is advantageous to apply the invention.

Further, as described in the first embodiment, when the insulating film is of a silicon oxide film, colloidal silica is more liable to be formed. Therefore, in this case, it is particularly advantageous to apply the invention.

In the first embodiment, as the chemical used at step S26 (the first chemical) and as the chemical used at step S30 (the second chemical), the example of the hydrofluoric acid solution of HF:H2O mixed at the ratio of 1:50 has been described. The first chemical and the second chemical, at step S22, may be of any chemical as long as the insulating films formed on the front and back surfaces of the semiconductor wafer 50 can be removed. For example, a hydrofluoric acid solution of HF:H2O mixed at a ratio of 1:200 may be used. As just described, a hydrofluoric acid solution of HF and H2O mixed at a different ratio may be used. Also, when the second chemical is an acid, a transfer of particles from the back surface 42 of the semiconductor wafer 50b to the front surface 40 of the semiconductor wafer 50a is liable to occur. Therefore, it is advantageous to apply the invention.

Further, as described in the first embodiment, when the second chemical contains a hydrofluoric acid, the transfer of particles is more liable to occur. Therefore, it is more advantageous to apply the invention.

Second Embodiment

Figure 10A:
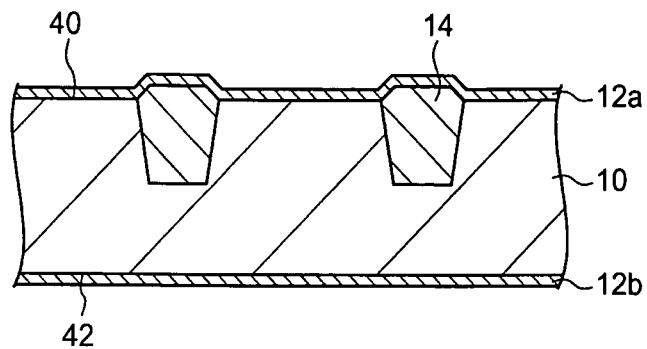
FIGS. 10A to 10D are cross sectional views showing a process for manufacturing a semiconductor device of a second embodiment.
Figure 10B:
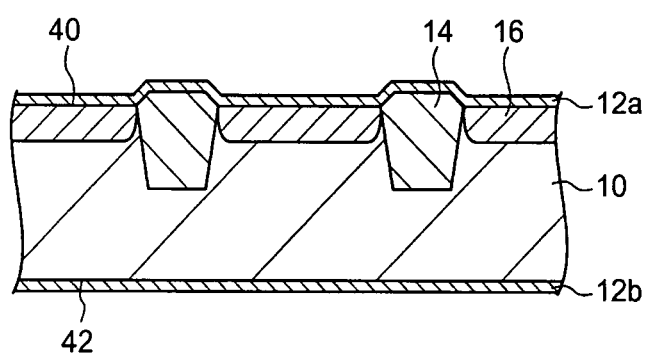
Figure 10C:
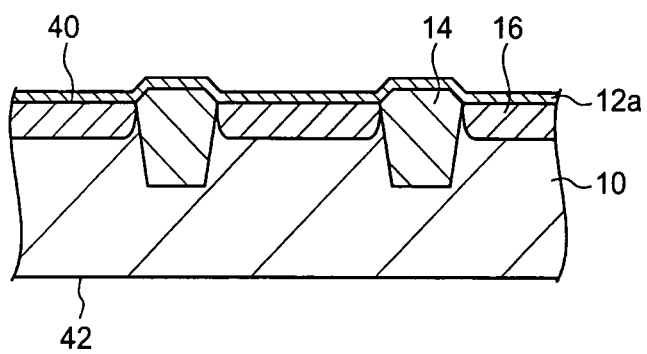
Figure 10D:
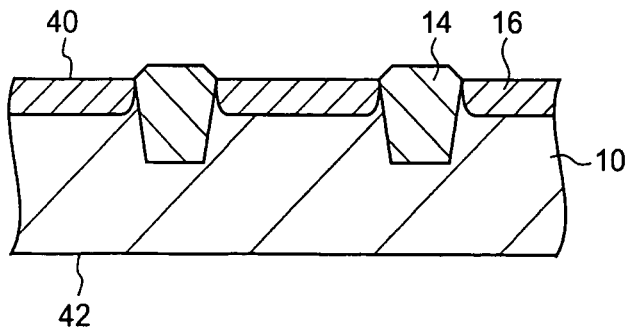

A second embodiment is an example of an insulating film being a through film for ion implantation. In reference to FIG. 10A, on the front surface 40 of a silicon semiconductor substrate 10 which is a semiconductor wafer, a shallow trench isolation (STI) oxidation layer 14 is formed. On the front surface 40 and the back surface 42 of the semiconductor substrate 10, using a CVD method, silicon oxide films 12a and 12b are formed. In reference to FIG. 10B, using the silicon oxide film 12a as a through film, an ion implantation to the semiconductor substrate 10 is carried out. Consequently, a diffusion layer 16 is formed in the semiconductor substrate 10. In reference to FIG. 10C, as similar to that of step S26 in FIG. 6 of the first embodiment, using the chemical treatment device of the single wafer processing type shown in FIG. 7, the silicon oxide film 12b on the back surface 42 of the semiconductor substrate 10 is removed. In reference to FIG. 10D, as similar to that of step 30 in FIG. 6 of the first embodiment, using the chemical treatment device of the batch processing type shown in FIGS. 1A and 1B, the silicon oxide film 12a on the front surface 40 of the semiconductor substrate 10 is removed. Carrying out subsequent manufacturing processes of the semiconductor device completes the semiconductor device.

As a surface of a stage of an ion implantation device is liable for particles of photoresist and such to be adhered, after the ion implantation process, the back surface 42 of the semiconductor wafer 50 is liable for the particles to be adhered. Consequently, when the insulating film is formed on both surfaces of the semiconductor wafer 50 (step S22 in FIG. 6) after the ion implantation process (step S20 in FIG. 6) as described in the first embodiment or when the insulating film is formed on both surfaces of the semiconductor wafer 50 (FIG. 10A) before the ion implantation process (FIG. 10B) as described in the second embodiment, and thereafter the chemical treatment device of the batch processing type is used when removing the insulating film on the front surface 40 of the semiconductor wafer 50, the front surface 40 of the semiconductor wafer 50 is liable for particles to be adhered. Therefore, when the process of ion implanting to the front surface 40 of the semiconductor wafer 50 (step S20 shown in FIG. 6 and FIG. 10B) is carried out before the process of removing the insulating film formed on the back surface 42 (step S26 shown in FIG. 6 and FIG. 10C), it is advantageous to apply the invention.

While the ion implantation process of the second embodiment has been described as an example of particles being adhered onto the back surface 42 of the semiconductor wafer 50, in any processes in which the back surface 42 of the semiconductor wafer 50 makes contact with a chuck of the semiconductor manufacturing apparatus, the back surface 42 of the semiconductor wafer 50 is liable for particles to be adhered. Therefore, when carrying out the processes in which the back surface 42 of the semiconductor wafer 50 makes contact with the chuck of the semiconductor manufacturing apparatus prior to the process of removing the insulating film formed on the back surface 42 of the semiconductor wafer 50, the invention is also applicable. Here, the chuck means a stage which secures the semiconductor wafer by a mechanical or an electrical means.

Third Embodiment

Figure 11A:
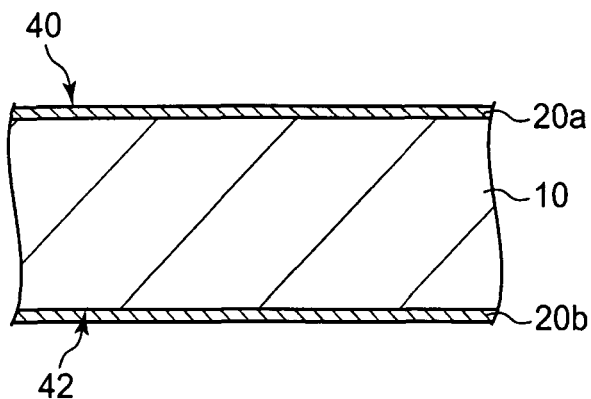
FIGS. 11A to 11C are cross sectional views (part 1) showing a process for manufacturing a semiconductor device of a third embodiment.
Figure 11B:
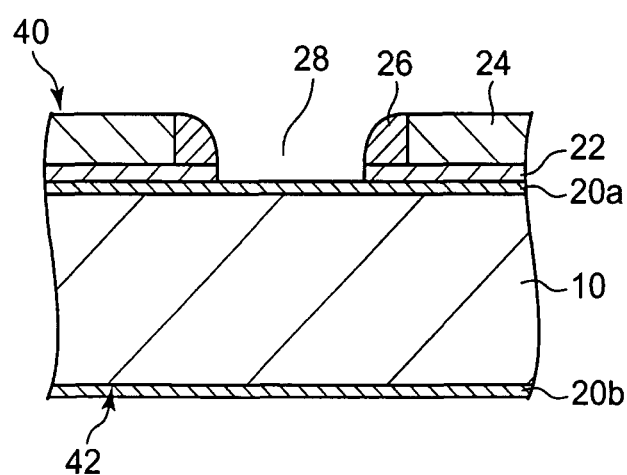
Figure 11C:
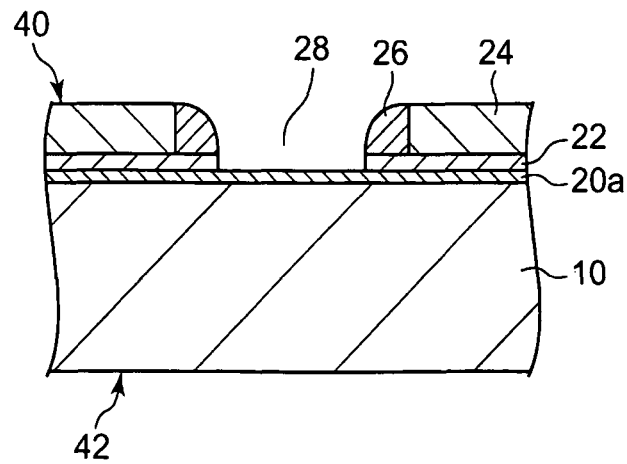

A third embodiment is an example of an insulating film being a tunnel oxide film. In reference to FIG. 11A, on the front surface 40 and the back surface 42 of the silicon semiconductor substrate 10, a tunnel oxide film 20a including a silicon oxide film and an oxide film 20b are formed using, for example a thermal oxidation method. In reference to FIG. 11B, over the tunnel oxide film 20a on the front surface 40 side of the semiconductor substrate 10, a trap layer 22 is formed. Over the trap layer 22, a sacrificial layer 24 including a silicon oxide film is formed and an opening 28 is formed on the sacrificial layer 24. On the side surface of the opening 28, a sidewall layer 26 including polysilicon is formed. Using the sacrificial layer 24 and the sidewall layer 26 as masks, the trap layer 22 is etched. In reference to FIG. 11C, as similar to that of step S26 in FIG. 6 of the first embodiment, using the chemical treatment device of the single wafer processing type shown in FIG. 7, the oxide film 20b on the back surface 42 of the semiconductor substrate 10 is removed.

Figure 12A:
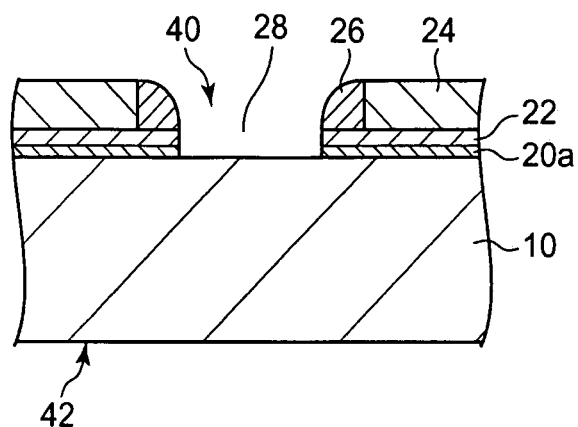
FIGS. 12A to 12C are cross sectional views (part 2) showing the process for manufacturing the semiconductor device of the third embodiment.
Figure 12B:
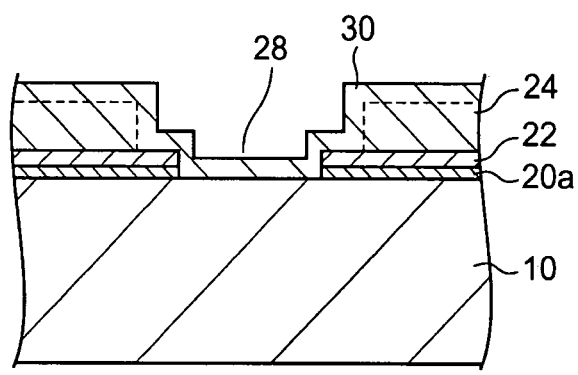
Figure 12C:
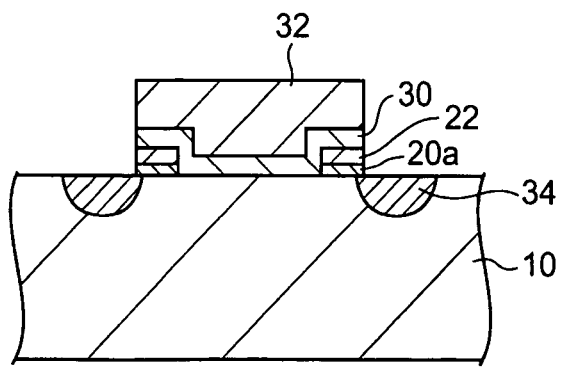

In reference to FIG. 12A, as similar to that of step 30 in FIG. 6 of the first embodiment, using the chemical treatment device of the batch processing type shown in FIGS. 1A and 1B, the tunnel oxide film 20a on the front surface 40 of the semiconductor substrate 10 is removed. In reference to FIG. 12B, after the sidewall layer 26 is removed, inside the opening 28 and over the sacrificial layer 24, a top oxide film 30 including a silicon oxide film is formed. Inside the opening 28 and on the top oxide film 30, a word line 32 including polysilicon is formed. Using the word line 32 as a mask, the top oxide film 30, the sacrificial layer 24, the trap layer 22 and the tunnel oxide film 20a are removed. In the semiconductor substrate 10, a bit line 34 is formed. As described above, a non-volatile memory transistor having an ONO film (oxide film/nitride film/oxide film) is completed.

As described in the third embodiment, at step S22 shown in FIG. 6 of the first embodiment, the insulating films formed on both surfaces of the semiconductor wafer 50 may be of the tunnel oxide film 20a and the oxide film 20b. As film quality is of importance to the tunnel oxide film 20a, a thermal oxidation method is used. When a thermal oxidation method is used, oxide films are formed on the front surface 40 and the back surface 42 of the semiconductor substrate 10. Therefore, it is advantageous to apply the invention.

Fourth Embodiment

A fourth embodiment is an example of an apparatus for manufacturing a semiconductor device to realize the first to third embodiments of the invention. In reference to FIG. 13, a semiconductor manufacturing apparatus 80 of the fourth embodiment has a carrier 82, a single wafer carrier 84, a single wafer processor 86, baths 88 to 94, a dryer 96 and a controller 98. The single wafer processor 86 (a first processor) is the chemical treatment device of the single wafer processing type shown in FIG. 7. The chemical bath 88 (a second processor) is the chemical treatment device of the batch processing type shown in FIGS. 1A and 1B. Rinsing baths 90 and 94 are of the same structure as the chemical bath 88 and, using water in place of chemical, the chemical adhered to the semiconductor wafer is replaced with water. The dryer 96 dries out the semiconductor wafer after rinsing. The carrier 82 carries a plurality of semiconductor wafers 50 of every processing batch contained in a wafer carrier to the single wafer carrier 84, the baths 88 to 94, and to the dryer 96. The controller 98 controls the carrier 82, the single wafer carrier 84, the single wafer processor 86, each of the baths 88 to 94, and the dryer 96.

Along an arrow 100 in solid line, a processing flow of the semiconductor wafer will be described. First, the plurality of semiconductor wafers contained in the wafer carrier is introduced to the carrier 82. The carrier 82 carries the wafer carrier containing the plurality of semiconductor wafers to the single wafer carrier 84. The single wafer carrier 84 carries a single piece of semiconductor wafer out of the plurality of semiconductor wafers contained in the wafer carrier in a batch unit carried from the carrier 82 to the single wafer processor 86. In the single wafer processor 86, as the chemical treatment is finished, the semiconductor wafer is returned to the wafer carrier and then the next single piece of semiconductor wafer is carried to the single wafer processor 86. Consequently, as the treatment of the entire semiconductor wafers in the batch is finished, the single wafer carrier 84 returns the plurality of semiconductor wafers contained in the wafer carrier to the carrier 82. The carrier 82 sequentially carries the plurality of semiconductor wafers as contained in the wafer carrier to the chemical bath 88, the rinsing bath 90, the chemical bath 92, the rinsing bath 94, and to the dryer 96. Each of the baths 84 to 94 and the dryer 96 carry out their respective processes. As a whole series of the processes is finished, the carrier 82 carries the semiconductor wafers to the outside.

The apparatus for manufacturing the semiconductor device of the fourth embodiment has the single wafer processor (the first processor) which removes the silicon oxide film (the first insulating film) formed on the back surface 42 by selectively providing the hydrofluoric acid solution (the first chemical) onto the back surface 42 of the semiconductor wafer, the chemical bath 88 (the second processor) which removes the silicon oxide film (the second insulating film) formed on the front surface by immersing the plurality of semiconductor wafers to the hydrofluoric acid solution (the second chemical), and the controller 98 which carries out the plurality of semiconductor wafers to be processed one at a time in the single wafer processor 86 and then the plurality of semiconductor wafers to be processed simultaneously in the chemical bath 88. Consequently, the method for manufacturing the semiconductor device of the first to third embodiments can be automatically carried out.

Figure 13:
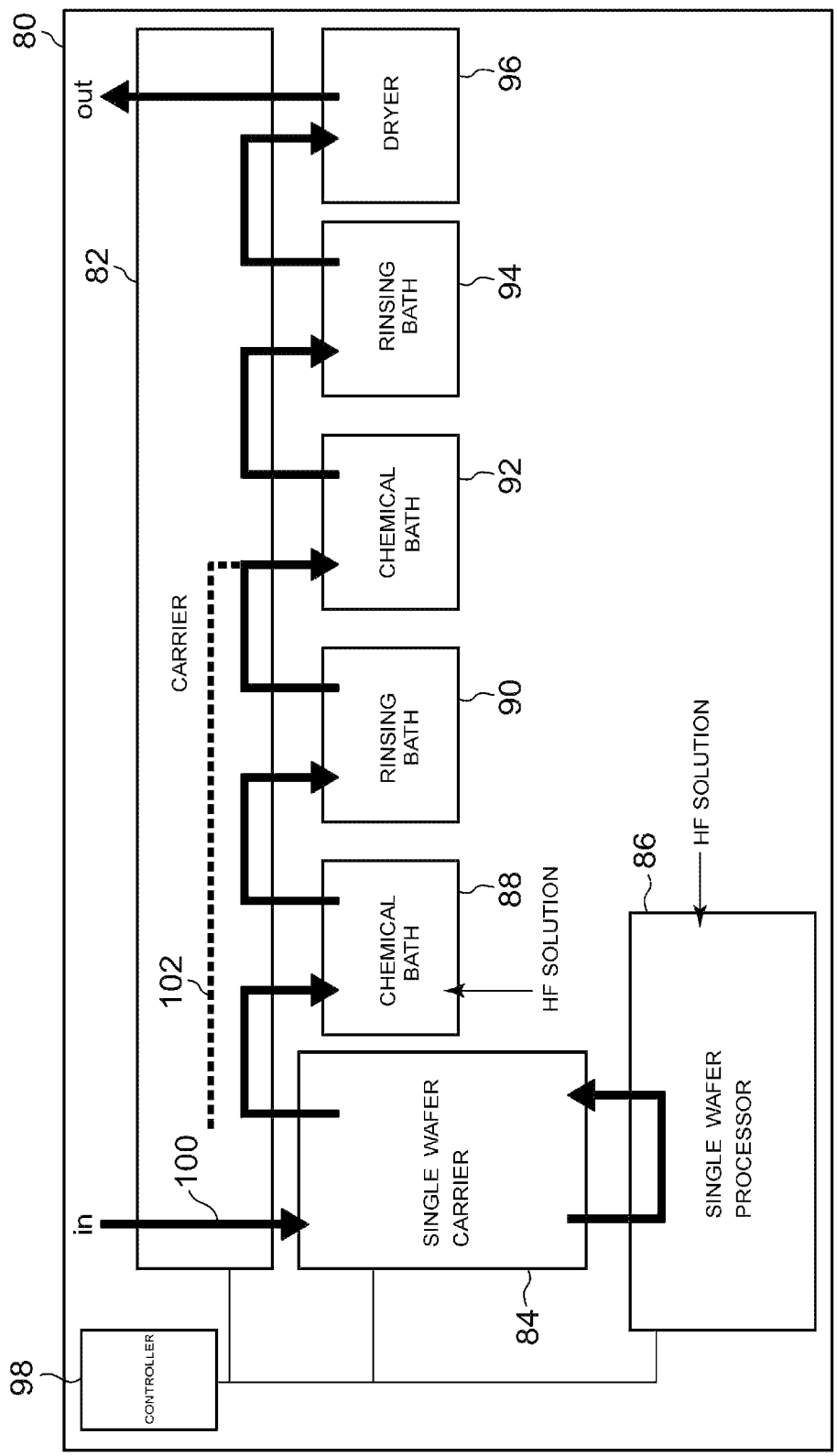
FIG. 13 is a schematic view of an apparatus for manufacturing a semiconductor device of a fourth embodiment.

When the single wafer processing is not carried out, as indicated by an arrow 102 in broken line in FIG. 13, the controller 98 may carry out the chemical treatment without going through the single wafer processor 86.

Several aspects of the present invention are summarized below.

According to an aspect of the present invention, there is provided a method for manufacturing a semiconductor device including: forming an insulating film on a front surface of a semiconductor wafer that is a surface on which a semiconductor element is to be formed and on a back surface that is a surface opposing the front surface; removing the insulating film formed on the back surface by selectively providing a first chemical on the back surface of the semiconductor wafer; and removing the insulating film formed on the front surface by simultaneously immersing more than one such semiconductor wafer in a second chemical. Accordingly, when removing the insulating film formed on both the front and back surfaces of the semiconductor wafer, the adhesion of particles onto the front surface of the semiconductor wafer can be prevented.

In the above method, the insulating film may include at least one of silicon oxide and silicon nitride. Accordingly, the adhesion of colloidal silica that is generated when removing the insulating film onto the surface of the semiconductor wafer can be prevented.

In the above method, the insulating film may be a silicon oxide film.

In the above method, the first chemical and the second chemical may be an acid. Accordingly, even when removing the insulating film by using an acid that is liable to cause the transfer of particles onto the surface of the semiconductor wafer, the transfer of particles can be prevented.

In the above method, the first chemical and the second chemical may include hydrofluoric acid.

In the above method, the method may further include: implanting ions on the front surface of the semiconductor wafer prior to removing the insulating film formed on the back surface. Accordingly, even when performing ion-implantation that is liable to cause the adhesion of particles onto the back surface of the semiconductor wafer, the adhesion of particles onto the front surface of the semiconductor wafer can be prevented.

In the above method, the method may further include: making the back surface into contact with a chuck of a semiconductor manufacturing apparatus prior to removing the insulating film formed on the back surface. Accordingly, even when performing a process of making the back surface of the semiconductor wafer into contact with the chuck of the semiconductor manufacturing apparatus that is liable to cause the adhesion of particles onto the back surface of the semiconductor wafer, the adhesion of particles onto the front surface of the semiconductor wafer can be prevented.

In the above method, the forming the insulating film may be forming a tunnel oxide film. Accordingly, when forming the insulating film on both surfaces of the semiconductor wafer as the tunnel oxide film, the adhesion of particles onto the front surface of the semiconductor wafer can be prevented.

According to another aspect of the present invention, there is provided an apparatus for manufacturing a semiconductor device including: a first processor that removes, by selectively providing a first chemical on a back surface of a semiconductor wafer that is a surface opposing a front surface of the semiconductor wafer that is a surface on which a semiconductor element is to be formed, a first insulating film formed on the back surface; a second processor that removes, by immersing more than one such semiconductor wafer in a second chemical, a second insulating film formed on the front surface; and a controller that processes the plurality of semiconductor wafers one at a time with the first processor and then processes the semiconductor wafers simultaneously with the second processor. Accordingly, it is possible to provide the apparatus for manufacturing a semiconductor device that prevents the adhesion of particles to the front surface of the semiconductor wafer.

In the above apparatus, the first chemical and the second chemical may be an acid.

Thus, when removing the insulating film formed on both the front and back surfaces of the semiconductor wafer, the adhesion of particles onto the front surface of the semiconductor wafer can be prevented.

While the preferred embodiments of the present invention have been described in details above, the invention is not limited to those specific embodiments and, within the spirit and scope of the invention as defined in the appended claims, various modifications and alterations may be made.

We claim:

1. A method for manufacturing a semiconductor device, the method comprising:

forming an insulating film on a front surface and on a back surface of an individual semiconductor wafer,
wherein the front surface is a surface on which a semiconductor element is to be formed, and
wherein the back surface is a surface opposing the front surface;

removing the insulating film formed on the back surface by selectively providing a first chemical on the back surface of the individual semiconductor wafer while flowing nitrogen over the front surface and rotating the individual semiconductor wafer relative to a nozzle supplying the first chemical to the back surface, wherein the first chemical comprises HF and $H_2O$; and removing the insulating film formed on the front surface by performing a series of operations comprising a HF treatment followed by an APM treatment followed by an HPM treatment.

2. The method for manufacturing a semiconductor device according to claim 1, wherein the insulating film includes at least one of silicon oxide and silicon nitride.

3. The method for manufacturing a semiconductor device according to claim 1, wherein the insulating film is a silicon oxide film.

4. The method for manufacturing a semiconductor device according to claim 1, further comprising:

implanting ions on the front surface of the individual semiconductor wafer prior to removing the insulating film formed on the back surface.

5. The method for manufacturing a semiconductor device according to claim 1, further comprising:

bringing the back surface into contact with a chuck of a semiconductor manufacturing apparatus prior to removing the insulating film formed on the back surface.

6. The method for manufacturing a semiconductor device according to claim 1, wherein the forming the insulating film comprises forming a tunnel oxide film.

7. The method for manufacturing a semiconductor device according to claim 1, wherein the series of operations are performed simultaneously on a plurality of semiconductor wafers comprising the individual semiconductor wafer such that the back surface of the individual semiconductor wafer faces a front surface of another wafer of the plurality of semiconductor wafers during at least the HF treatment.

8. The method for manufacturing a semiconductor device according to claim 1, wherein the individual semiconductor wafer is suspended above a stage facing the front surface of the individual semiconductor wafer by flowing the nitrogen.

9. The method for manufacturing a semiconductor device according to claim 8, wherein the individual semiconductor wafer is rotated by rotating the stage.

10. The method for manufacturing a semiconductor device according to claim 8, wherein flowing the nitrogen over the front surface and between the stage and the front surface prevents the first chemical from contacting the front surface of the individual semiconductor wafer.

11. The method for manufacturing a semiconductor device according to claim 1, wherein the first chemical is jet sprayed from the nozzle onto the back surface of the individual semiconductor wafer.

12. The method for manufacturing a semiconductor device according to claim 1, further comprising, prior to forming the insulating film, performing ion implantation of dopants into the front surface of the individual semiconductor wafer.

13. The method for manufacturing a semiconductor device according to claim 12, further comprising, after forming the insulating film, performing a thermal treatment to activate the ion implanted dopants in the front surface of the individual semiconductor wafer.

14. The method for manufacturing a semiconductor device according to claim 1, wherein a concentration ratio of HF to $H_2O$ in the first chemical is 1:50.

15. The method for manufacturing a semiconductor device according to claim 1, wherein a concentration ratio of HF to $H_2O$ in the first chemical is 1:200.

16. The method for manufacturing a semiconductor device according to claim 1, wherein the insulating film is formed over a shallow trench isolation (STI) oxidation layer disposed on the front surface of the individual semiconductor wafer.

\* \* \* \* \*